United States Patent
Kidu et al.

(10) Patent No.: US 8,282,436 B2
(45) Date of Patent: Oct. 9, 2012

(54) LIGHT EMITTING DEVICE, ELECTRONIC DEVICE, AND METHOD OF MANUFACTURING LIGHT EMITTING DEVICE

(75) Inventors: Takashi Kidu, Ome (JP); Satoru Shimoda, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/846,881

(22) Filed: Jul. 30, 2010

(65) Prior Publication Data

US 2011/0025189 A1 Feb. 3, 2011

(30) Foreign Application Priority Data

Jul. 31, 2009 (JP) ................... 2009-180187

(51) Int. Cl.
*H01J 9/24* (2006.01)
(52) U.S. Cl. ............... 445/24; 313/506; 313/509
(58) Field of Classification Search ............ 445/3, 23, 445/24, 58, 59; 313/498–512
See application file for complete search history.

(56) References Cited

U.S. PATENT DOCUMENTS

| 7,910,271 B2* | 3/2011 | Inoue | 430/7 |
| 8,002,601 B2* | 8/2011 | Kitazume | 445/24 |
| 2002/0192600 A1* | 12/2002 | Okamura et al. | 430/320 |
| 2005/0158738 A1* | 7/2005 | Okamura et al. | 435/6 |
| 2006/0115598 A1* | 6/2006 | Kaneko et al. | 427/307 |
| 2008/0074037 A1* | 3/2008 | Fukase et al. | 313/504 |

FOREIGN PATENT DOCUMENTS

| JP | 2002-075640 A | 3/2002 |
| JP | 3328297 B2 | 12/2002 |
| JP | 2009-026671 A | 2/2009 |
| JP | 2009-075194 A | 4/2009 |

OTHER PUBLICATIONS

Japanese Office Action dated May 17, 2011 (and English translation thereof) in counterpart Japanese Application No. 2009-180187.

* cited by examiner

*Primary Examiner* — Bumsuk Won
(74) *Attorney, Agent, or Firm* — Holtz, Holtz, Goodman & Chick, PC

(57) ABSTRACT

A light emitting device having at least one pixel having a light emitting element includes a substrate, a partition wall formed over the substrate, and a luminous layer of the light emitting element, where the luminous layer is formed in at least one groove partitioned by the partition wall. The partition wall has a plurality of first partition walls and at least one second partition wall. Each of the first partition walls is extending in the first direction and the second partition wall is formed to extend in a second direction orthogonal to the first direction and connect end portions of the plurality of first partition walls. A lyophobic degree of the second partition wall is lower than that of a center region between both ends of each of the first partition walls in the first direction.

3 Claims, 12 Drawing Sheets

LIGHT EMITTING DEVICE, ELECTRONIC DEVICE, AND METHOD OF MANUFACTURING LIGHT EMITTING DEVICE

FIELD

The present invention relates to a light emitting device, an electronic device and a method of manufacturing the light emitting device.

CROSS-REFERENCE TO RELATED APPLICATIONS

This application is based upon and claims the benefit of priority from prior Japanese Patent Applications No. 2009-180187, filed Jul. 31, 2009, the entire contents of all of which are incorporated herein by reference.

BACKGROUND

Light emitting devices include a light emitting device which uses, for example, an organic EL (ElectroLuminescence) element as a light emitting element. The organic EL element has an anode electrode, a cathode, and an organic EL layer (luminous layer) formed between the pair of electrodes. One organic EL element becomes one pixel.

The luminous layers are formed for a plurality of pixels at a time in such a way as to cover regions on the substrate which are partitioned by partition walls as disclosed in Unexamined Japanese Patent Application KOKAI Publication No. 2002-75640. The regions on the substrate which are partitioned by partition walls are bottoms of grooves formed by the partition walls and the substrate.

The following is one way of fabricating such a luminous layer. First, a solution (hereinafter called ink) which contains a material for a luminous layer is applied to grooves formed by the partition walls and the substrate where a plurality of electrodes (a plurality of pixel electrodes, such as a plurality of anode electrodes) are formed. Application of the ink is carried out by ink jet printing, nozzle printing or the like. The applied ink is dried to form the luminous layers covering the grooves formed by the partition walls and the substrate.

It is desirable that the luminous layers should be formed to cover all of the plurality of electrodes on the substrate. To achieve such formation, the ink is applied in such a way as to cover the entire bottom surfaces of the grooves formed by the partition walls and the substrate, and is then dried to form the luminous layers.

However, the present inventor discovered that even if the ink were applied in such a way as to cover the entire bottom surfaces of the grooves to form the luminous layers, some regions at the bottom surfaces of the grooves might not be covered by the luminous layers.

Such a phenomenon seems to also occur in the formation of other light emitting elements having a structure similar to that of an organic EL element.

SUMMARY

Accordingly, it is an object of the present invention to provide a light emitting device, an electronic device, and a method of manufacturing the light emitting device, which can eliminate or reduce regions at the bottoms of the grooves formed by partition walls which are not covered by luminous layers.

To achieve the object, according to one aspect of the invention, there is provided a light emitting device having at least one pixel having a light emitting element, and including:
a substrate;
a partition wall formed over the substrate; and
a luminous layer of the light emitting element, where the luminous layer is formed in at least one groove partitioned by the partition wall,
the partition wall having a plurality of first partition walls and at least one second partition wall where each of the first partition walls is extending in the first direction and the second partition wall is formed in such a way as to extend in a second direction orthogonal to the first direction and connect end portions of the plurality of first partition walls,
a lyophobic degree of the second partition wall is lower than that of a center region between both ends of each of the first partition walls in the first direction.

To achieve the object, according to another aspect of the invention, there is provided an electronic device including:
an operational unit; and
a display unit having a display device that displays image information according to display data.

The display device includes:
a substrate;
a partition wall formed on the substrate; and
a luminous layer of the light emitting element, where the luminous layer is formed in at least one groove partitioned by the partition wall,
the partition wall having a plurality of first partition walls and at least one second partition wall wherein each of the first partition walls is extending in the first direction and the second partition wall is formed in such a way as to extend in a second direction orthogonal to the first direction and connect end portions of the plurality of first partition walls,
a lyophobic degree of the second partition wall is lower than that of a center region between both ends in the first direction of each of the first partition walls in the first direction.

To achieve the object, according to a further aspect of the invention, there is provided a method of manufacturing a light emitting device having at least one pixel having a light emitting element.

The method includes:
a partition-wall forming step of forming a plurality of first partition walls in such a way as to extend in a first direction over a substrate and partition a luminous-layer forming region where a luminous layer of the light emitting element is to be formed, and at least one second partition wall in such a way as to extend in a second direction orthogonal to the first direction and connect end portions of the plurality of first partition walls;
a lyophobic-degree adjusting step of adjusting lyophobic degrees of the first partition walls and the second partition wall in such a way that the lyophobic degree of the second partition wall becomes lower than that of a center region between both ends in the first direction of each of the first partition walls in the first direction.

BRIEF DESCRIPTION OF THE DRAWINGS

A more complete understanding of this application can be obtained when the following detailed description is considered in conjunction with the following drawings, in which.

DETAILED DESCRIPTION

An embodiment of the present invention will now be described with reference to the accompanying drawings. The invention is not limited to the embodiment (including what is shown in the diagrams) described below. Various modifications may be made to the embodiment described below. The components of the embodiment described below may be omitted as needed.

Although the following describes a light emitting device (display device) which uses an organic EL element as a light emitting element, the light emitting device according to the invention may use a light emitting element other than an organic EL element.

To begin with, the outline of the configuration of a light emitting device 1 according to the embodiment.

Figure 1:
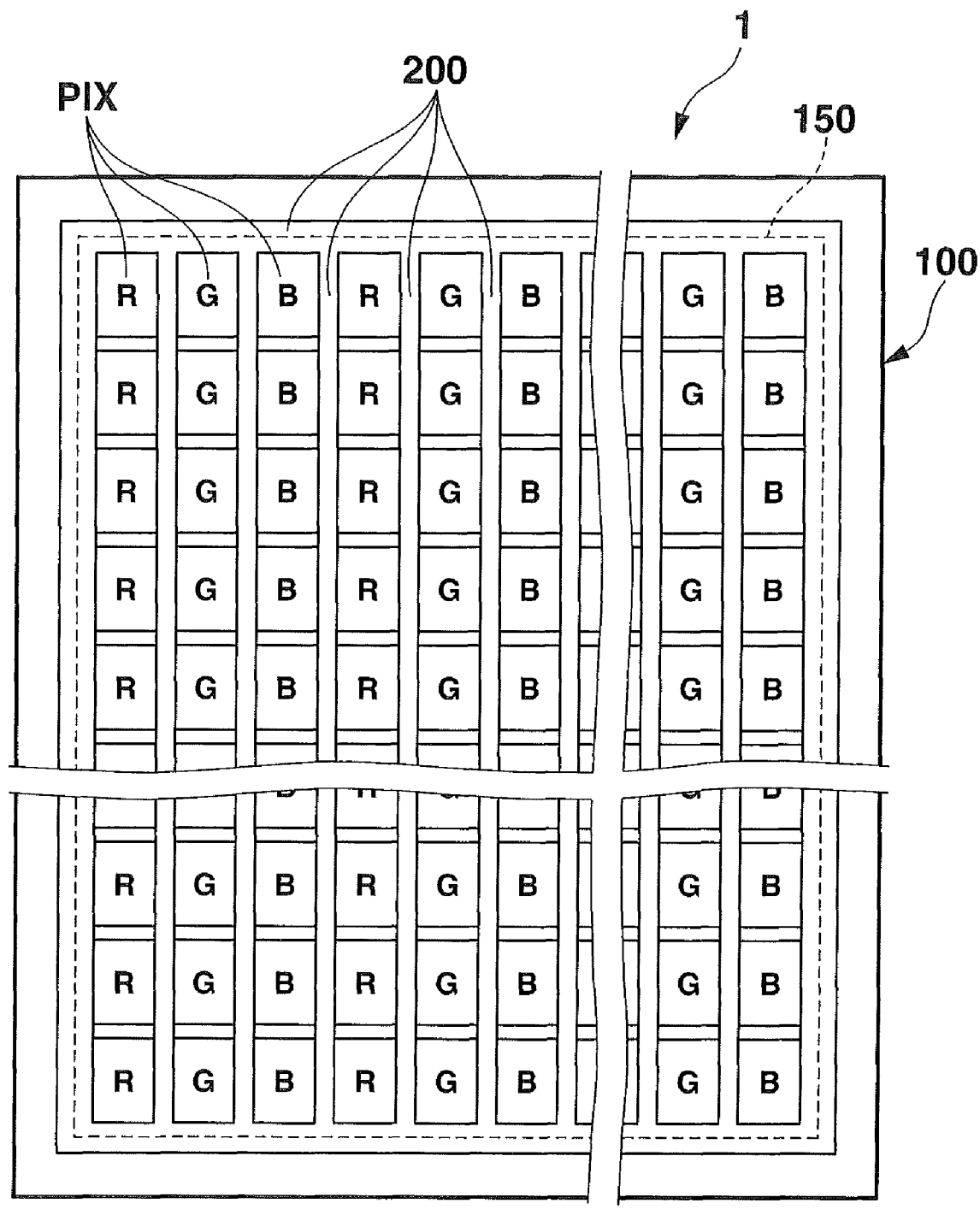
FIG. 1 is a diagram showing the outline of the configuration of a light emitting device according to one embodiment of the invention.

FIG. 1 is a diagram showing the outline of the configuration of the light emitting device 1 according to the embodiment of the invention.

The light emitting device 1 has a substrate 100 where a display region 150 having a plurality of pixels PIX laid out is formed on one surface. The substrate 100 is formed by, for example, separating a large substrate where a plurality of substrates 100 are formed, into individual substrates 100.

As shown in FIG. 1, a plurality of pixels PIX each having a light emitting element, which emits light of any one of R (Red), G (Green) and B (Blue) colors, are laid out in a matrix form. The pixels PIX arranged in such a way that a plurality of pixels PIX having light emitting elements which emit light of R (Red) color, a plurality of pixels PIX having light emitting elements which emit light of G (Green) color and a plurality of pixels PIX having light emitting elements which emit light of B (Blue) color are aligned in the column direction for each color, and are laid out in the row direction in the order of the pixel PIX having the light emitting element which emits light of R (Red) color, the pixel PIX having the light emitting element which emits light of G (Green) color, and the pixel PIX having the light emitting element which emits light of B (Blue) color.

As shown in FIG. 1, a partition wall 200 is formed on one surface of the substrate 100 to partition formation regions for the light emitting elements of the individual pixels PIX. Those regions enclosed by the partition wall 200 are the regions where the light emitting elements of the individual pixels PIX are to be formed. The regions enclosed by the partition wall 200 are aligned in a stripe form in the column direction. The partition wall 200 has parts formed to extend in the column direction, and parts formed to extend in the row direction to be connected to both end portions of the column directional parts. The column directional parts of the partition wall 200 are formed in regions between the formation regions for the light emitting elements of the individual pixels PIX which are laid out adjacent to one another in the row direction. As will be described later, various transistors, various capacitors, various wirings, etc. for driving the light emitting elements in the pixels PIX are formed between one surface of the substrate 100 and the bottom of the partition wall 200.

Next, a manufacturing method for the light emitting device 1 according to the embodiment (light emitting device manufacturing method) will be described below referring to FIGS. 2 to 15.

Figure 2:
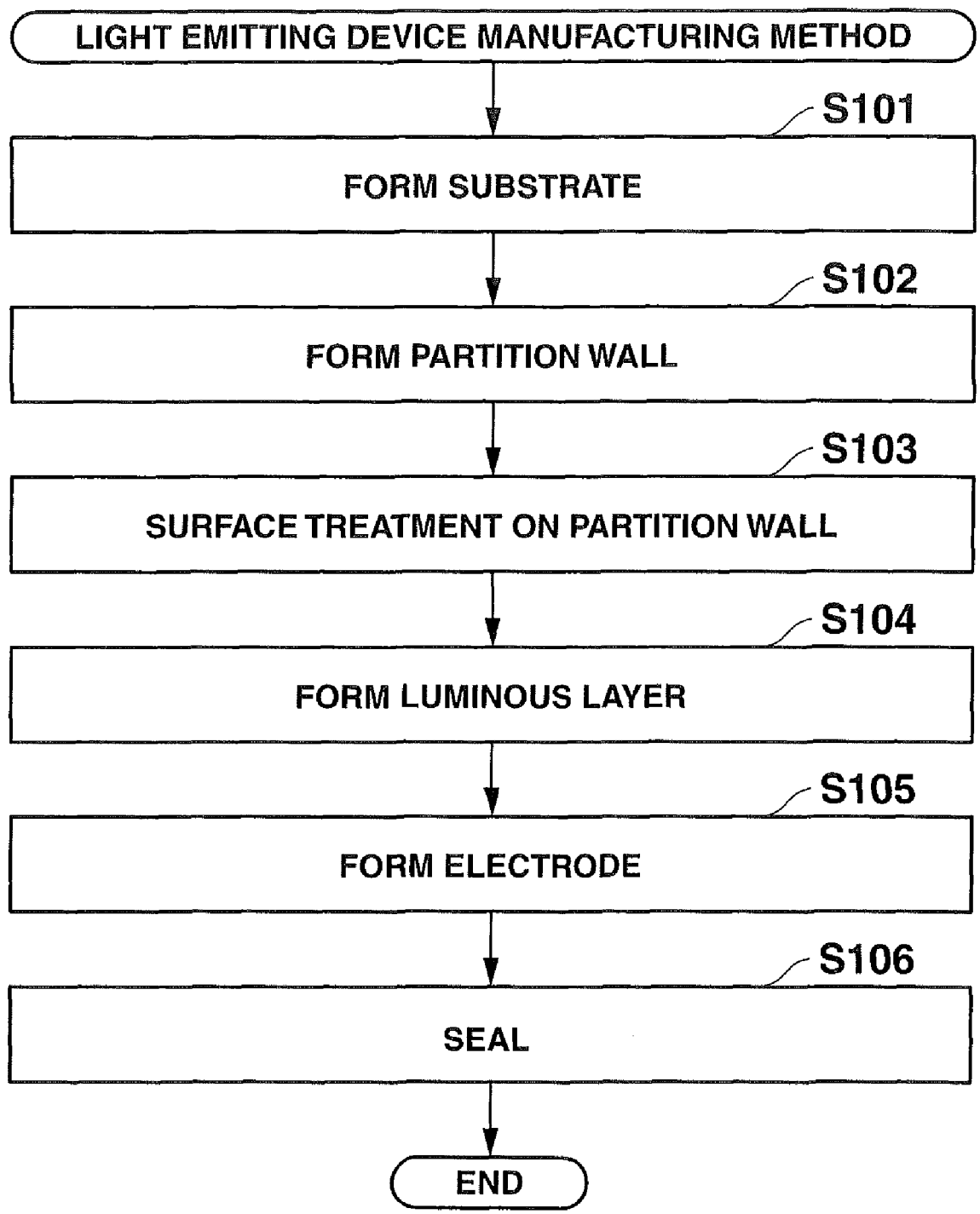
FIG. 2 is a flowchart for explaining a method of manufacturing the light emitting device according to the embodiment of the invention.

FIG. 2 is a flowchart for explaining the method of manufacturing the light emitting device according to the embodiment of the invention.

Figure 3:
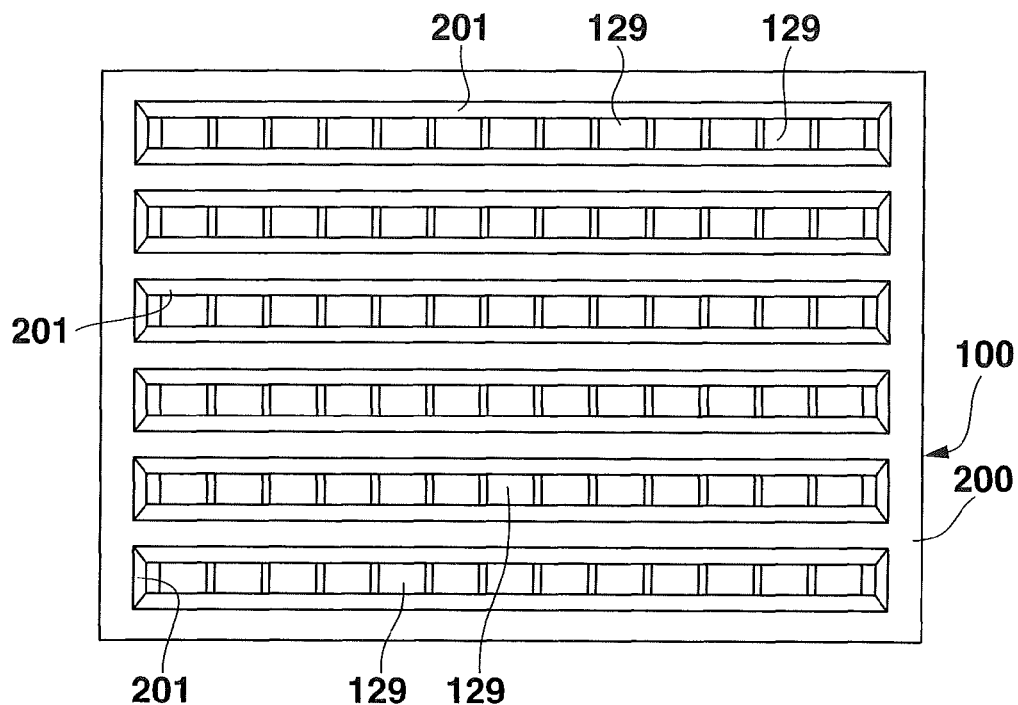
FIG. 3 is a diagram for explaining the method of manufacturing the light emitting device according to the embodiment of the invention, showing a substrate and a partition wall in the stage where the substrate and the partition wall are formed.
Figure 4:
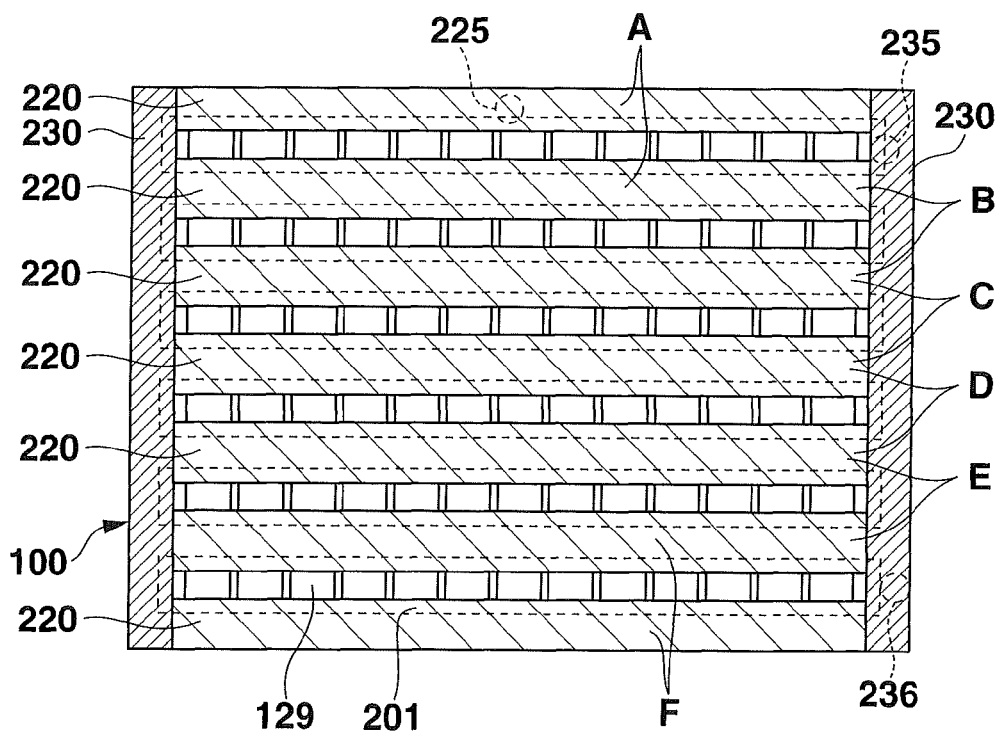
FIG. 4 is diagram showing the relation between a first partition wall and a second partition wall.
Figure 5:
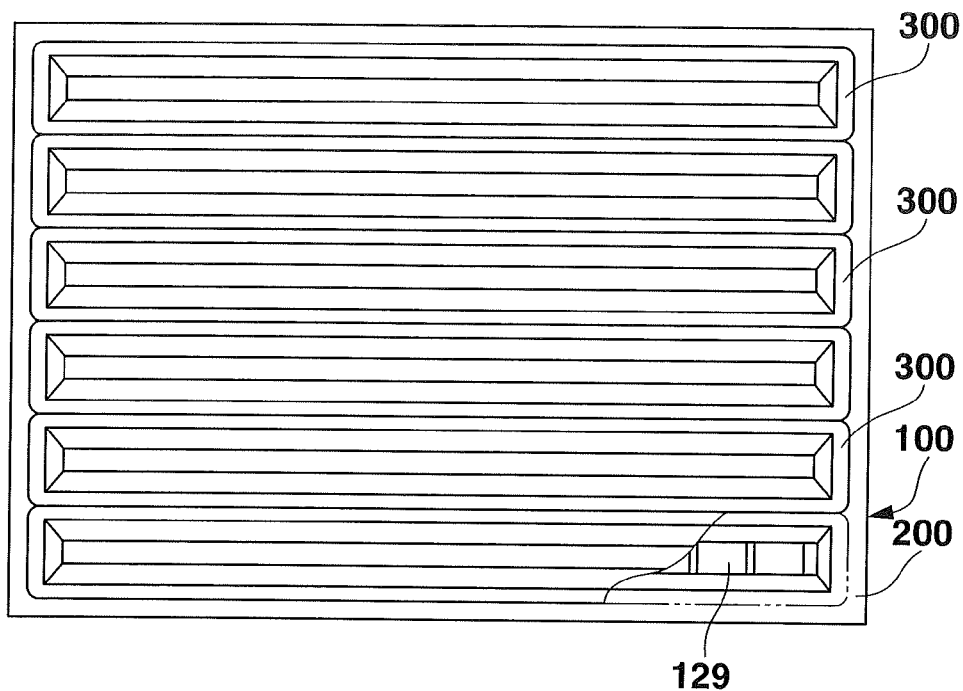
FIG. 5 is a diagram for explaining the method of manufacturing the light emitting device according to the embodiment of the invention, showing the substrate, the partition wall, and a luminous layer in the stage where the substrate, the partition wall and the luminous layer are formed.
Figure 6:
FIG. 6 is a diagram for explaining the method of manufacturing the light emitting device according to the embodiment of the invention, showing the substrate, the partition wall, the luminous layer, and an opposing electrode in the stage where the substrate, the partition wall, the luminous layer, and the opposing electrode are formed.

FIGS. 3 to 6 are diagrams for explaining the method of manufacturing the light emitting device according to the embodiment of the invention. FIG. 3 is a diagram showing the substrate and the partition wall in the stage where the substrate and the partition wall are formed, FIG. 4 is diagram showing the relation between a first partition wall and a second partition wall, FIG. 5 is a diagram showing the substrate, the partition wall, and a luminous layer in the stage where the substrate, the partition wall and the luminous layer are formed, and FIG. 6 is a diagram showing the substrate, the partition wall, the luminous layer, and an opposing electrode in the stage where the substrate, the partition wall, the luminous layer, and the opposing electrode are formed.

Figure 7A:
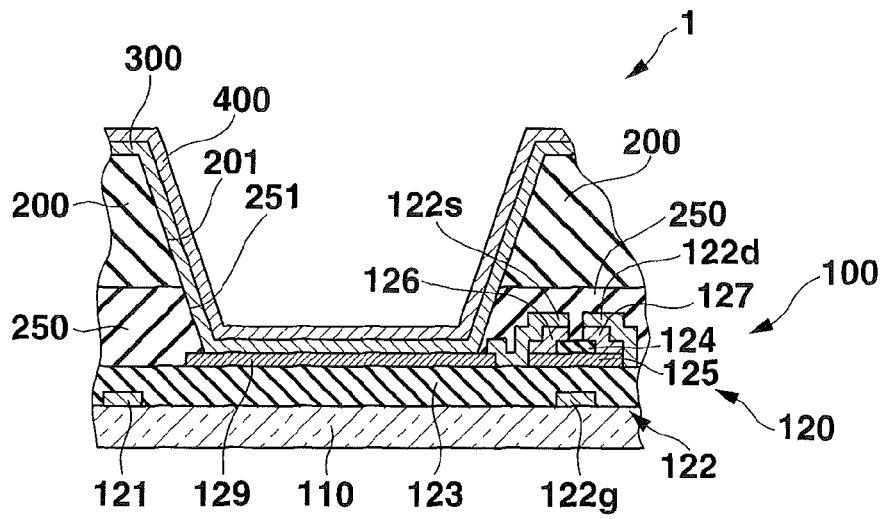
FIGS. 7A and 7B are schematic cross-sectional views along line VII-VII in FIG. 6.
Figure 7B:
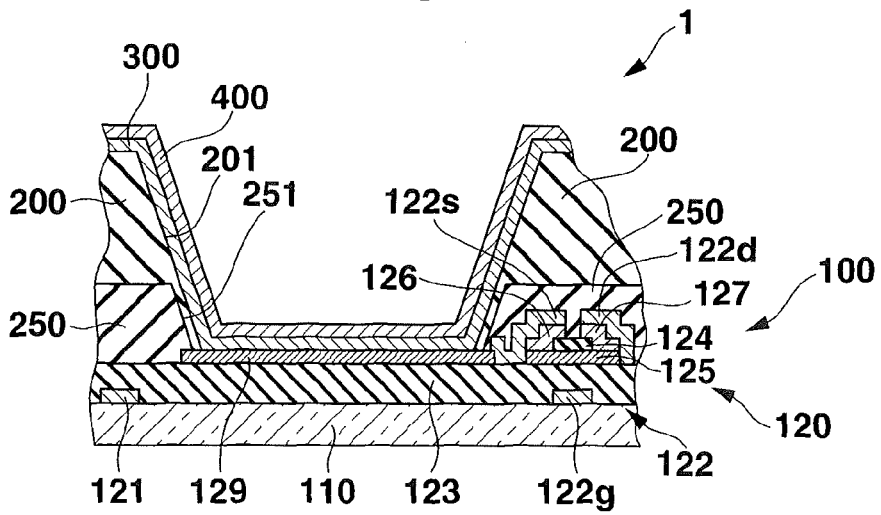

FIGS. 7A and 7B are schematic cross-sectional views along line VII-VII in FIG. 6.

FIGS. 3 to 6 show the substrate 100 whose direction is changed from the one in FIG. 1 by 90 degrees with the lateral direction in the diagrams being the column direction for the sake of convenience.

Referring to FIG. 2, the outline of the manufacturing method for the light emitting device will be explained. First, the substrate 100 is formed (step S101). Next, the partition wall 200 is formed on the substrate 100 formed in step S101 (step S102).

Next, a surface treatment is performed on the surface of the partition wall 200 (step S103). Then, ink is applied into openings 201 subjected to the surface treatment in step S103 to form luminous layers 300 (step S104).

Next, an opposing electrode 400 is formed (step S105), after which sealing is carried out (step S106). Through the above steps, the light emitting device 1 is manufactured.

The individual manufacturing steps will be described in detail below.

(1) Step S101

In step S101, the substrate 100 is formed. Since a substrate with a known structure can be used as the substrate 100, the following describes only the outline of one example of the method of fabricating the substrate 100 and one example of the structure of the substrate 100. The structure of the substrate 100 and the method of fabricating the same will be described below referring to the structures shown in FIGS. 7A and 7B by way of example.

Specifically, the substrate 100 is formed by forming a laminate 120 having a plurality of layers laminated in order on a base 110 prepared, as shown in FIGS. 7A and 7B. The substrate 100 has the base 110 and the laminate 120. The laminate 120 includes a plurality of layers, such as an electrode layer, a semiconductor layer and an insulating layer, formed in, for example, a predetermined planar shape. Various transistors, various capacitors, various wirings, etc. which constitute a circuit for causing the luminous layer 300 to emit light are formed by the laminate 120. That is, the substrate 100 (laminate 120) adequately has various transistors, various capacitors, various wirings, etc. which constitute a circuit for causing the luminous layer 300 to emit light. The planar shape is the shape as viewed in the direction of the substrate 100 from above the surface of the substrate 100 (surface where the laminate 120 is formed).

The outline of one example of the method of fabricating the substrate 100 will be described below.

In one example of the method of fabricating the substrate 100, first, the transparent base 110 made by a glass substrate or the like is prepared.

Next, a conductive film formed by, for example, an Mo film, Cr film, Al film, Cr/Al laminated film, AlTi alloy film, AlNdTi alloy film, MoNb alloy film or the like is formed on the base 110 by sputtering, vacuum deposition or the like.

Then, the formed conductive film is patterned into a predetermined pattern. As a result, wirings 121, gate electrodes 122g of transistors 122, etc. are formed on the base 110. The transistor 122 is a light-emission drive transistor which drives the luminous layer. The wiring 121 is, for example, a data line which electrically connects the drain electrode of a selection transistor for selecting a light emitting element to emit light, and a data driver for driving the light emitting device.

Subsequently, an insulating film 123 is formed on the wirings 121 and the gate electrodes 122g by CVD (Chemical Vapor Deposition) or the like.

Next, the a semiconductor layer of amorphous silicon or the like is formed on the formed insulating film 123 by CVD or the like.

Next, the an insulating film of SiN or the like, for example, is formed on the formed semiconductor layer by CVD or the like. Subsequently, the formed semiconductor layer is patterned by photolithography or the like to form a stopper film 124 of a predetermined shape.

Then, a film of amorphous silicon or the like containing an n-type impurity is formed on the semiconductor layer and the stopper film 124 by CVD or the like.

Then, this film and the semiconductor layer are patterned by photolithography or the like to form a semiconductor layer 125 and ohmic contact layers 126, 127.

Next, a transparent conductive film of ITO or the like, or a light reflection conductive film and a transparent conductive film of ITO or the like are coated on the insulating film 123 by sputtering, vacuum deposition or the like, after which pixel electrodes 129 are formed by patterning by photolithography.

Subsequently, contact holes or through holes for forming a contact portion to electrically connect conductive layers (e.g., transistor electrode and wiring) formed at different layers are formed in the insulating film 123.

Next, a source-drain conductive film formed by, for example, an Mo film, Cr film, Al film, Cr/Al laminated film, AlTi alloy film, AlNdTi alloy film, MoNb alloy film or the like is coated on the contact-hole formed insulating film 123 by sputtering, vacuum deposition or the like, and is patterned by photolithography to form drain electrodes 122d and source electrodes 122s. At the same time, the contact portions are formed adequately. Each of the source electrode 122s is formed in such a way as to overlie part of the respective pixel electrode 129.

Next, an interlayer insulating film made of an insulating material, such as a silicon nitride film, is formed on the insulating film 123 in such a way as to cover the drain electrode 122d, the source electrode 122s, etc. by CVD or the like.

Then, openings 251 of a desired shape are formed in the interlayer insulating film 250 by photolithography.

The interlayer insulating film 250 having the openings 251 formed therein to expose a plurality of pixel electrodes 129 is formed in this way (see FIGS. 7A and 7B).

The laminate 120 is formed in the above manner.

In the above step, other transistors than the transistor 122, such as the selection transistor, are adequately formed in the step.

In the step, wirings other than the wiring 121, such as an anode line (supply voltage line) which is connected directly or indirectly to a power supply of a predetermined high potential and is applied with a voltage (supply voltage) of a predetermined high potential sufficient higher than a reference voltage to be applied to the opposing electrode 400, are adequately formed. In addition, capacitors, etc., which are used in emission of the light emitting elements, for example, are also adequately formed.

The interlayer insulating film 250 insulates the adjoining pixel electrodes 129 from each other, and electrically insulates and protects devices, wirings, etc. exposed to the top surface of the laminate 120 before formation of the interlayer insulating film 250 from the outside. The devices to be protected include the transistor 122. The wirings to be protected include the power supply line.

(2) Step S102

In step S102, the partition wall 200 is formed on the substrate 100 formed in step S101.

One example of the method of fabricating the partition wall 200 will be described below.

In the one example of the method of fabricating the partition wall 200, first, an insulating material, such as photosensitive polyimide, is applied onto the substrate 100 having the interlayer insulating film 250 formed thereon in such a way as to cover the interlayer insulating film 250 (substrate 100).

Then, the applied insulating material is exposed and developed via a mask corresponding to a desired shape. As a result, the insulating material, such as photosensitive polyimide, is patterned to form the partition wall 200 having the openings 201 of the desired shape (see FIG. 7A).

The opening 201 is formed into a shape matching, for example, the opening 251. A plurality of pixel electrodes 129 are exposed through the openings 251.

In the structure shown in FIG. 7A, the partition wall 200 is formed into a shape corresponding to the interlayer insulating film 250.

In this case, the inner wall surface of the opening 251 and the inner wall surface of the opening 201 are formed at the same level as shown in FIG. 7A, for example. However, both inner wall surfaces may be formed to have a step therebetween.

The inner wall surface of the opening 201 in the partition wall 200 is inclined to the normal line (direction perpendicular to the top surface of the base 110 (side where the laminate 120 is formed)) as shown in, for example, FIG. 7A.

The partition wall 200 may be formed in the mode shown in FIG. 7B. In the structure shown in FIG. 7B, the partition wall 200 is formed on the interlayer insulating film 250, covering the opening 251 of the interlayer insulating film 250.

Lyophilic property vesting process and a lyophobic property vesting process which will be described later are performed on the surface of the partition wall 200.

In the structure shown in FIG. 7A, part of the side face of the interlayer insulating film 250 is exposed to the inner wall surface of the opening 251. When the lyophobic property vesting process to be described later is performed on the surface of the partition wall 200 in this structure, the lyophobic property vesting process is also performed on the that side of the insulating film 250 which is exposed to the opening 251 of the interlayer insulating film 250, then lowering the wettability of that of the insulating film 250. According to the embodiment, therefore, it is preferable that the partition wall 200 should cover the opening 251 of the interlayer insulating film 250 to prevent exposure of the interlayer insulating film 250.

The partition wall 200 serves to make the height from the substrate surface higher to prevent the applied ink from entering other regions when the luminous layers 300 is formed. Normally, the height of the partition wall 200 is greater than the height of the interlayer insulating film 250.

The partition wall 200 divide the ink to define the shape of the luminous layer 300. It is desirable that the partition wall 200 should be made of an insulating material.

As shown in FIG. 3 and other diagrams, the opening 201 of the partition wall 200 defines the shape of the luminous layer 300. The openings 201 are laid out in a stripe form in the column direction.

The opening 201 has a substantially rectangular planar shape, for example, with both lengthwise (column directional) ends closed. Accordingly, the luminous layer 300 formed in the opening 201 is formed over a plurality of pixels which are aligned in the column direction to have a substantially rectangular shape corresponding to the planar shape of the opening 201. The planar shape of the opening 201 is not limited to the shape with its both ends closed, and may have one end closed and the other end open.

Since the partition wall 200 illustrated in FIG. 3 and other diagrams, when having a structure in cross section as shown in FIG. 7A, is taller than the interlayer insulating film 250, the opening 251 or the like is omitted as needed in FIG. 3 and other diagrams to make it easier to understand the structure. The partition wall illustrated in FIG. 3 and other diagrams may have the structure as shown in cross section in FIG. 7B.

As shown in FIG. 4, the partition wall 200 has a plurality of first partition walls 220 laid out in parallel extending in the column direction. The first partition walls 220 are shown as dark-gray portions in FIG. 4. The plurality of first partition walls 220 form plural pairs of first partition walls A, B, C, . . . formed in a stripe form. Two first partition walls 220 adjoining in the row direction form a pair of first partition walls A, B, C, . . . . Here, the row direction is the direction perpendicular to the column direction, and is the up-down direction in the diagram of FIG. 4.

When there are two first partition walls 220, one on each side a single first partition wall 220 in the row direction, the central first partition wall 220 forms two pairs of first partition walls A, B with the two first partition walls 220 on both sides, respectively.

That is, the one first partition wall 220 (e.g., the second first partition wall 220 from the top in FIG. 4) may be shared in two sets of first partition walls (e.g., A and B).

The partition wall 200 may be shaped to have at least one set of a pair of first partition walls 220.

The first partition wall 220 has a shape elongated in a first direction (column direction), which is a substantially rectangular (including a rectangular shape).

Further, as shown in FIG. 4, the partition wall 200 has second partition walls 230 each connecting one ends of a pair of first partition walls A, B, C, . . . in the lengthwise direction of the first partition walls A, B, C, . . . . The second partition walls 230 are hatched regions (hatching does not indicate a cross section) in FIG. 4. The second partition walls 230 are formed on both end sides of the second partition walls 230.

That is, the partition wall 200 has two second partition walls 230 provided on the respective ends of each first partition wall 220, each second partition wall 230 connecting one lengthwise ends of a pair of first partition walls A, B, C, . . . .

The partition wall 200 may have the second partition wall 230 only on one end side of the first partition walls A, B, C, . . . . That is, at least one second partition wall 230 is sufficient. When there is one second partition wall 230, the opening 201 has a shape whose one lengthwise end is closed while the other end is open (substantially rectangular shape in this case).

The first partition walls 220 and the second partition walls 230 are formed integrally. The openings 201 are formed by the first partition walls 220 and the second partition walls 230.

Grooves are formed by the openings 201 and the regions of the substrate 100 which are exposed by the openings 201. That is, the grooves are formed by the first partition walls 220, the second partition walls 230, and the substrate 100.

The partition wall 200 may take another shape. The partition wall 200 may be shaped to have the openings 201 in a lattice form. In this case, the lengthwise extending partition wall should be regarded as the first partition wall 220 while the partition wall extending in the direction perpendicular in the lengthwise direction should be regarded as the second partition wall 230.

(3) Step S103

In step S103, a surface treatment is performed on the surface of the partition wall 200 (including the inner wall surfaces of the openings 201 as needed).

The present inventor has performed a lyophobic property vesting process on the entire surface of the partition wall 200 after a lyophilic property vesting process was performed on the regions on the substrate 100 which are exposed through the openings 201, and the entire surface of the partition wall 200 as the conventional surface treatment.

The lyophobic property vesting process allows the ink applied to the openings 201 (grooves) of the partition wall 200 to be repelled from the surface of the partition wall 200. This prevents the ink from going over the partition wall 200 (especially, the first partition walls 220) to enter the adjoining grooves.

However, the present inventor discovered that when the ink was applied into the grooves to form the luminous layers 300 after performing such a surface treatment, there might occur the phenomenon that a region uncovered with the luminous layer 300 would be formed at the bottom of the groove (top surface of the substrate 100 exposed through the opening 201).

This phenomenon may inhibit one or more pixel electrodes 129 or the like located near the lengthwise ends of the first partition walls 220 from being covered with the luminous layers 300.

The lyophilic property vesting process includes a process with irradiation of ultraviolet rays, an $O_2$ (oxygen) plasma process, or the like. The lyophobic property vesting process includes a $CF_4$ (tetrafluoromethane) plasma process or the like.

Such a process can be carried out using a known technique, for example, as described in Japanese Patent No. 3328297.

It is to be noted that the lyophobic property indicates the property of repelling either a water solvent or an organic solvent by some degree equal to or greater than a predetermined reference level. The lyophilic property indicates the property of repelling either a water solvent or an organic solvent by some degree less than a predetermined reference level (i.e., the property of not repelling by a degree equal to or greater than the predetermined reference level). The value of the degree of the contact angle, for example, can be used as the predetermined reference level in which case it is said to be lyophilic when the contact angle is equal to or less than 40 degrees, and is said to be lyophobic when the contact angle is equal to or greater than 50 degrees.

Figure 8:
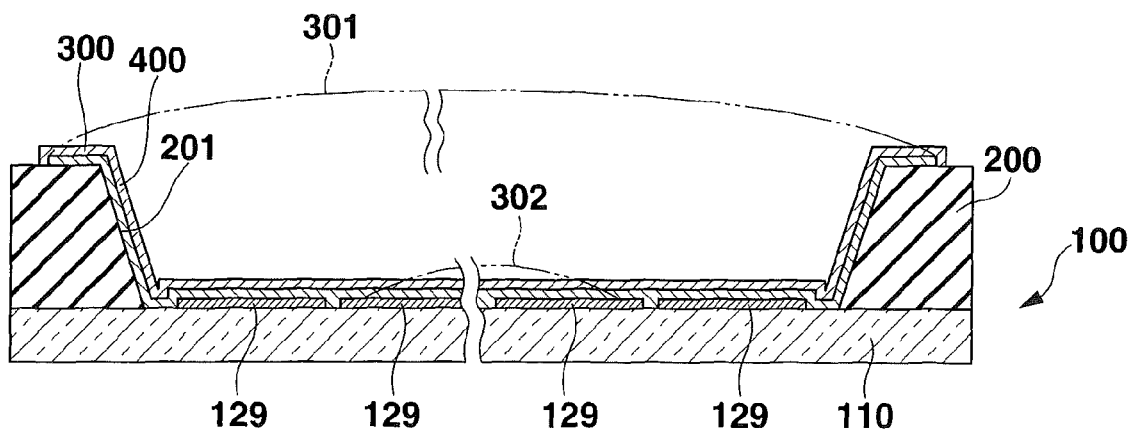
FIG. 8 is a schematic cross-sectional view along line VIII-VIII in FIG. 6.

FIG. 8 is a schematic cross-sectional view along line VIII-VIII in FIG. 6.

Figure 9:
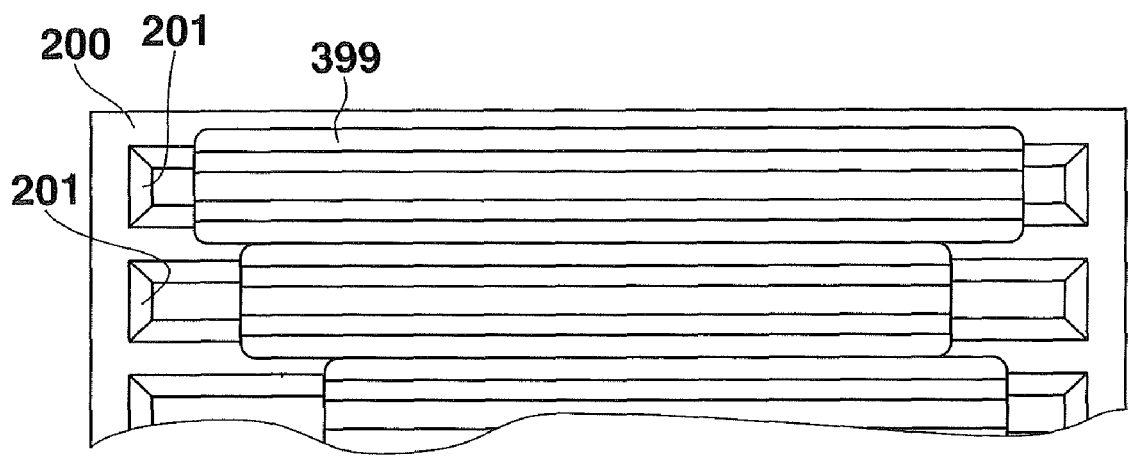
FIG. 9 is a diagram showing one example of the shape of a luminous layer which is formed by a conventional manufacturing method for a light emitting device, which has been carried out by the present inventor.

FIG. 9 is a diagram showing one example of the shape of the luminous layer which is formed by the conventional manufacturing method for a light emitting device, which has been carried out by the present inventor.

Through various examinations, the present inventor discovered that the following is the cause of the phenomenon that a region which is not covered with the luminous layer 300 is formed at the bottom of the groove.

Since the entire partition wall 200 is subjected to the lyophobic property vesting process conventionally, the surface of the second partition wall 230 is also made lyophobic. When the ink is applied into the groove after the lyophobic property vesting process, as the ink is applied to cover the entire bottom surface of the groove, so that upper level of the ink becomes an ink level 301 in FIG. 8 (the end portions of the ink level may be shifted outward in case of nozzle printing or the like).

Since the second partition wall 230 is made lyophobic at this time, the ink applied onto the second partition wall 230 is repelled at the surface of the second partition wall 230. The repelled ink is pushed back inside the opening 201 in the lengthwise direction thereof.

As an ink level 302 in FIG. 8, as a result, those end portions of the ink level 302 of the ink, once applied to fill in the groove the opening 201, which are positioned in the lengthwise direction of the opening 201, are shifted inward of the end portions of the opening 201. Accordingly, the end portions of a luminous layer 399 come inward of the end portions of the luminous layer 399 (see FIG. 9).

The present inventor discovered that even if the ink were applied to the groove in such a way as to cover the entire bottom surface thereof to form the luminous layer 399, some region at the bottom surface of the groove might not be covered by the luminous layers. Conventionally, in consideration of the possibility that some region may not be covered with the luminous layer 399 due to the phenomenon, the region is regarded as a dummy pixel in advance as a solution. In this case, the dimension of the substrate 100 for obtain the required display region should be increased by the dummy pixel regions provided.

It is to be noted that devices, the interlayer insulating film 250, etc. provided on the substrate 100 are properly omitted in FIG. 8. Especially, the partition wall 200 is illustrated exaggeratedly, and devices, the interlayer insulating film 250, etc. are properly omitted in FIG. 8. In addition, the pixel electrode 129, etc. are properly omitted in FIG. 9.

Through various examinations, the present inventor discovered that the foregoing inconveniences could be overcome or improved by performing a process of setting the lyophobic degree of the second partition wall 230 lower than the lyophobic degree of the center of the first partition wall 220 in the lengthwise direction thereof in the process of step S103.

That is, when the lyophobic degree of the second partition wall 230 is relatively low, it is possible to prevent or reduce repelling of the ink applied to the groove by the second partition wall 230. This makes it possible to prevent the ink from being forced back inside the opening in the aforementioned lengthwise direction (force-back of the ink) as mentioned above, or reduce the force-back of the ink. This can prevent occurrence of a region uncovered with the luminous layer 300 at the bottom surface of the groove formed by the partition wall 200 and the substrate 100, or reduce such an uncovered region as compared with what has occurred conventionally. According to the conventional manufacturing method for a light emitting device, how much the end portions of the luminous layer 399 comes inward of the end portions of the opening 201 is not stable, so that the dummy pixel region should be made comparatively large. According to the embodiment, however, the amount of the end portions of the luminous layer 399, if coming inward of the end portions of the opening 201, is relatively small and is comparatively stable. Therefore, the dummy pixel region, if provided, can be made smaller than that in the related art. This can make the dimension of the substrate 100 for obtaining the needed display region smaller than that in the related art.

The lyophobic degree is determined by the contact angle to the ink or the amount of the lyophobic material per unit area in a predetermined region. That is, the larger the amount of the lyophobic material per unit area, the higher the lyophobic degree.

The lyophobic degree of the center of the first partition wall 220 may be, for example, the lyophobic degree of the region of the center surface of the first partition wall 220 (e.g., region enclosed by a dotted circle 225 in FIG. 4). The "center" includes a vicinity of the center as well as the center itself.

The lyophobic degree of the second partition wall 230 is desirably the lyophobic degree in a region that includes at least that side of the second partition wall 230 which forms the inner wall surface of the opening 201 (e.g., region enclosed by a dotted circle 235 in FIG. 4), or a region that includes at least the surface region of the second partition wall 230 which is positioned outside that side (e.g., region enclosed by a dotted circle 236 in FIG. 4).

This is because that those regions are considered to significantly contribute to the force-back of the ink.

Particularly, the lyophobic degree can be derived by measuring the amount of the lyophobic material per unit area in such a region.

For example, in case where the amount of the lyophobic material per unit area in the region enclosed by the dotted circle 225 is compared with the amount of the lyophobic material per unit area in the region enclosed by the dotted circle 236, the lyophobic degree of the second partition wall 230 is set lower than the lyophobic degree of the center of the first partition wall 220 in the lengthwise direction by increasing the amount of the lyophobic material per unit area in the region enclosed by the dotted circle 225.

The lyophobic material is a material to be used in the lyophobic property vesting process (material having the lyophobic property), such as fluorine or a fluorine compound.

By performing the process of making the center surface of the first partition wall 220 contain a larger amount of the lyophobic material than the surface of the second partition wall 230, it is possible to eliminate or reduce the region uncovered with the luminous layer 300 at the bottom surface of the groove formed by the partition wall 200 and the substrate 100.

The following will describe two examples which can be applied to the surface treatment in step S103.

The aforementioned known methods can be adequately applied to methods for the lyophilic property vesting process and the lyophobic property vesting process to be described below. The $O_2$ (oxygen) plasma process to be described below can be adequately changed to a process of irradiating ultraviolet rays as needed. The $CF_4$ plasma process to be described below can also be adequately changed to another process as needed.

A. First Example

First, a first example that is applicable to the surface treatment in step S103 will be described.

Figure 10:
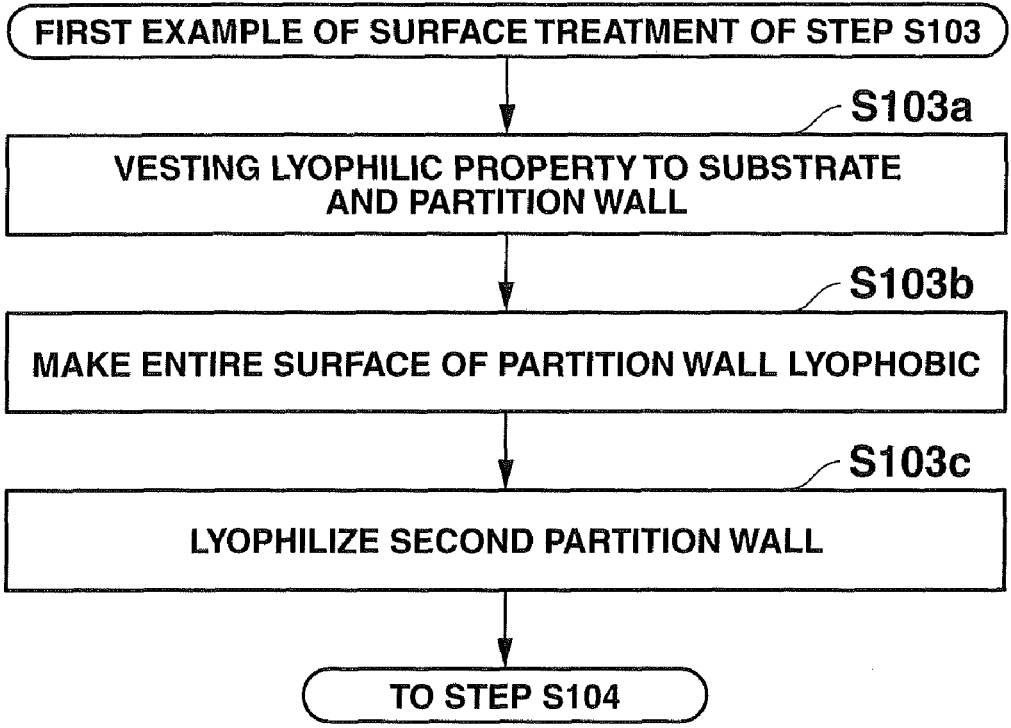
FIG. 10 is a flowchart for explaining a first example of step S103 in FIG. 2.

FIG. 10 is a flowchart for explaining the first example that is applicable to the surface treatment in step S103 in FIG. 2.

FIGS. 11A and 11B to FIG. 13 are diagrams for explaining an example of the lyophilic property vesting process according to the first example.

In the first example, first, the lyophilic property vesting process is performed on the region of the substrate 100 exposed through the opening 201 and the entire surface of the partition wall 200 (step S103a).

Specifically, $O_2$ plasma is irradiated onto a region (see the long dashed double-short dashed line in FIG. 11A) which includes the region of the substrate 100 exposed through the opening 201 and the entire surface of the partition wall 200, and lyophilize those regions.

This lyophilic property vesting process can be carried out using a parallel plate type or a barrel type plasma irradiation unit, for example. In this case, the substrate 100 which has the partition wall 200 formed thereon in step S102 is placed in the plasma irradiation unit, and $O_2$ plasma is irradiated onto the region of the substrate 100 exposed through the opening 201, and the entire surface of the partition wall 200 at a time, so that those regions can be lyophilized at a time.

The lyophilic property vesting process can be carried out using a spot type plasma irradiation unit 9. The structure in this case is shown in FIG. 11A.

Figure 11A:
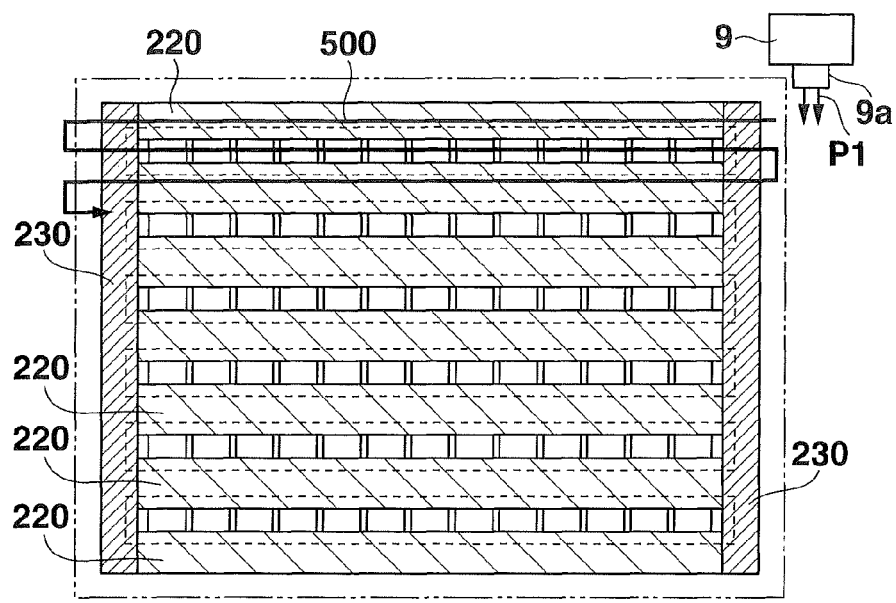
FIGS. 11A and 11B are diagrams for explaining an example of a lyophilic property vesting process according to the first example.
Figure 11B:
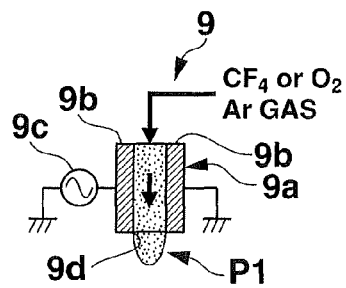

The outline of the spot type plasma irradiation unit 9 is shown in FIG. 11B. As shown in FIG. 11B, the spot type plasma irradiation unit 9 incorporates electrodes 9b for generating plasma, which are applied with a high-frequency voltage 9c. The plasma irradiation unit 9 further includes a reactor 9a which a gas containing $CF_4$ or $O_2$ and argon or the like is supplied between the electrodes 9b and generates a plasma correspond to those supplied gas. The plasma irradiation unit 9 discharges the plasma generated in the reactor 9a by a spot (locally) as a plasma jet P1 from an opening 9d provided in the end portion of the reactor 9a.

In this case, as shown in FIG. 11A, the plasma irradiation unit 9 is moved as indicated by an arrow 500 to irradiate the $O_2$ plasma jet P1 onto the region including the region of the substrate 100 exposed through the opening 201, and the entire surface of the partition wall 200.

This process can remove a residual or the like remaining on the region of the substrate 100 exposed through the opening 201, and the entire surface of the partition wall 200 to lyophilize those regions.

Next, the lyophobic property vesting process is performed on the entire surface of the partition wall 200 (step S103b).

Figure 12:
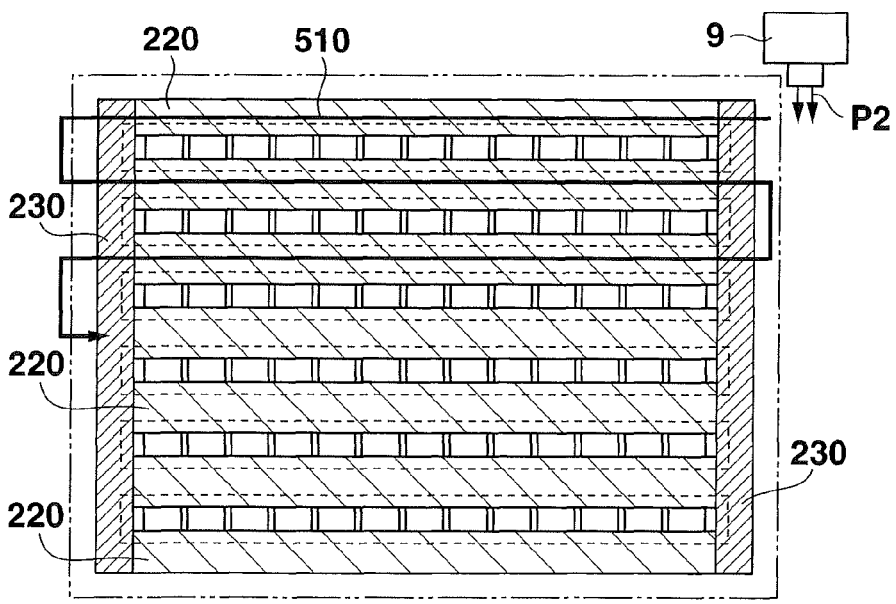
FIG. 12 is a diagram for explaining the example of a lyophobic property vesting process according to the first example.

Specifically, as shown in FIG. 12, a $CF_4$ plasma jet P2 is irradiated onto the entire surface of the partition wall 200 by the spot type plasma irradiation unit 9 (see the long dashed double-short dashed line).

In FIG. 12, the plasma irradiation unit 9 is moved as indicated by an arrow 510 to irradiate the $CF_4$ plasma jet P2 onto the entire surface of the partition wall 200. The plasma irradiation unit 9 has only to move in such a way as not to irradiate the top surface region of the substrate 100 exposed through the opening 201, but to irradiate the $CF_4$ plasma jet P2 onto the entire surface of the partition wall 200. This $CF_4$ plasma process can permit fluoride to remain on the surface of the partition wall 200 and lyophilize the surface thereof.

Next, the lyophilic property vesting process is performed on the second partition wall 230 (step S103c).

Figure 13:
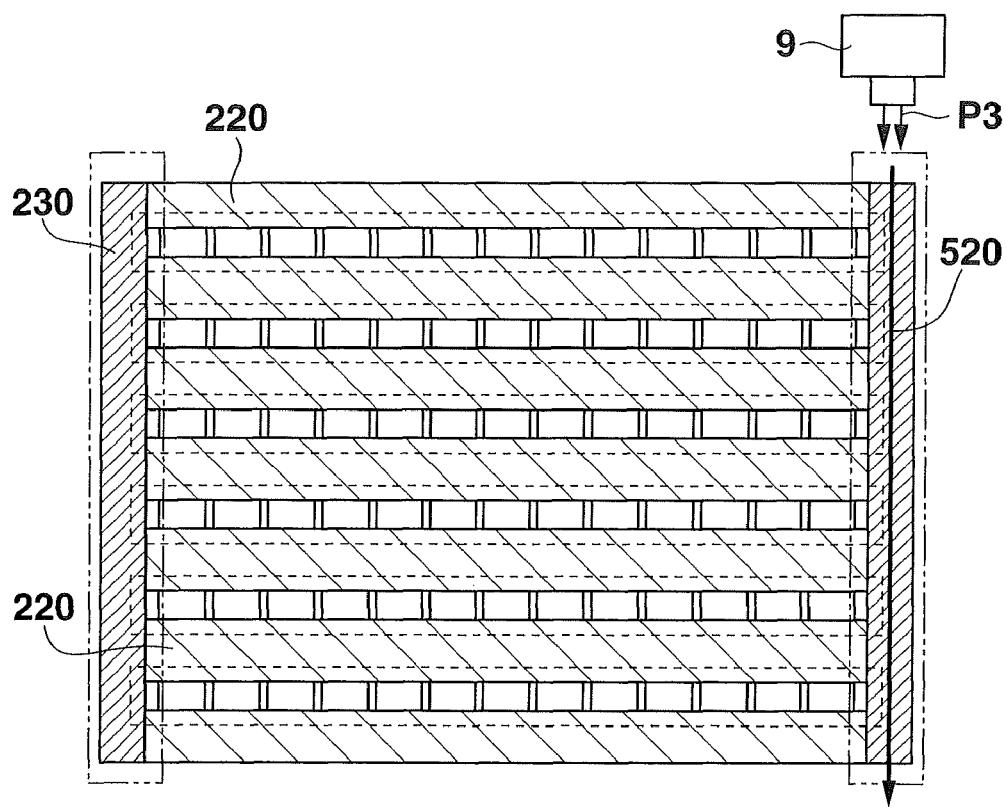
FIG. 13 is a diagram for explaining the example of the lyophilic property vesting process according to the first example.

Specifically, as shown in FIG. 13, an $O_2$ plasma jet P3 is irradiated onto the second partition wall 230 by the spot type plasma irradiation unit 9 (see the long dashed double-short dashed line).

In FIG. 13, the plasma irradiation unit 9 moves as indicated by an arrow 520 to irradiate the $O_2$ plasma jet P3 onto the second partition wall 230. The $O_2$ plasma process can remove fluorine on the region that is irradiated with the $O_2$ plasma jet P3 and lyophilize the region.

The process of setting the lyophobic degree of the second partition wall 230 lower than the lyophobic degree of the center of the first partition wall 220 in the lengthwise direction is carried out in the above manner.

Figure 15:
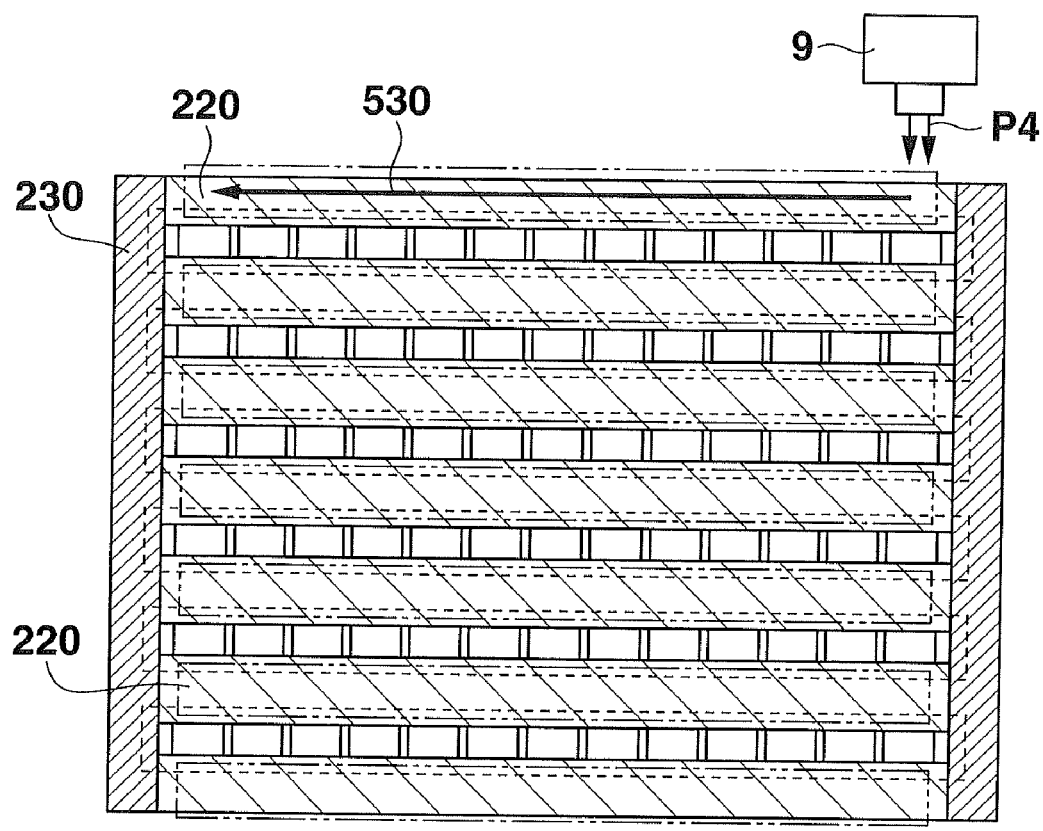
FIG. 15 is a diagram for explaining the example of the lyophobic property vesting process according to the second example.
Figure 16:
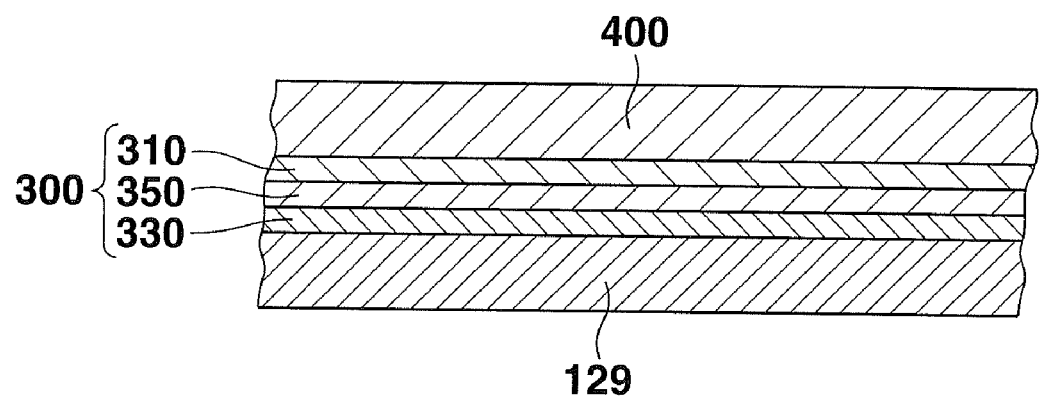
FIG. 16 is a cross-sectional view showing another example of a luminous layer included in the light emitting device according to the embodiment of the invention.

The shading and hatching in FIGS. 11 to 13 are given to clearly distinguish the first partition wall 220 from the second partition wall 230 (the same in FIG. 15). Especially, the hatching in FIGS. 11 to 13 does not show a cross section (the same in FIG. 15).

Lyophilic property vesting process of the second partition wall 230 after the lyophobic property vesting process of the partition wall 200 includes lyophilic property vesting process of the end portions of the first partition wall 220 in the lengthwise direction thereof (see FIG. 13).

As a result, the lyophobic degree of the end portions of the first partition wall 220 is made lower than the lyophobic degree of the center of the first partition wall 220. This makes it possible to prevent or reduce the force-back of the ink more.

It is desirable to lyophilize at least the surface of the second partition wall 230 which is located on the opening 201 side (particularly, the inner wall surface constituting the opening 201) at the time of performing lyophilic property vesting process of the second partition wall 230. This makes it possible to accurately prevent or reduce the force-back of the ink.

The second partition wall 230 can be lyophilized after the conventional ordinary lyophobic property vesting process by performing lyophilic property vesting process of at least the second partition wall 230 after performing the lyophobic property vesting process on the first partition wall 220 and the second partition wall 230.

Further, since the second partition wall 230 has a relatively narrow region, the moving distance of the plasma irradiation unit 9 is small. Therefore, the lyophobic degree of the second partition wall 230 can be easily made lower than the lyophobic degree of the center of the first partition wall 220 in the lengthwise direction by merely making a slight modification to the process that has been performed conventionally.

B. Second Example

Next, a second example that is applicable to the surface treatment in step S103 will be described.

Figure 14:
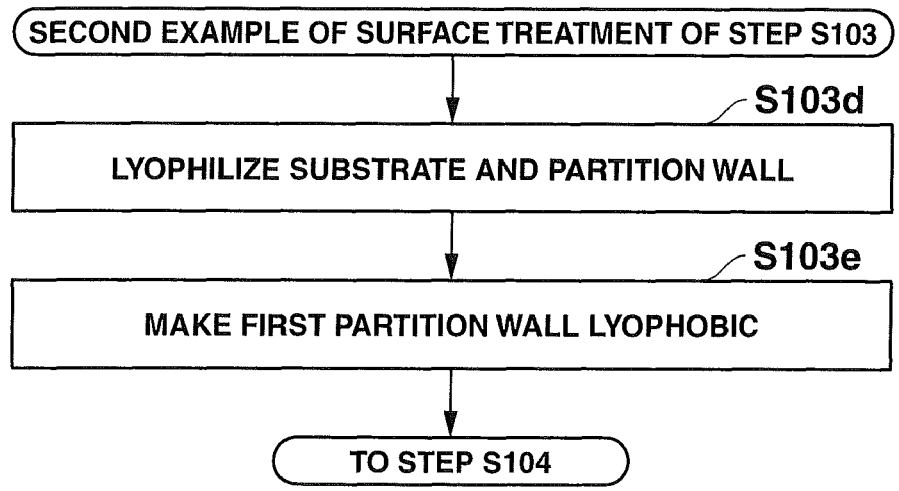
FIG. 14 is a flowchart for explaining a second example of step S103 in FIG. 2.

FIG. 14 is a flowchart for explaining the second example that is applicable to the surface treatment in step S103 in FIG. 2.

FIG. 15 is a diagram for explaining an example of the lyophobic property vesting process according to the first example.

In the second example, first, the lyophilic property vesting process is performed on the region of the substrate 100 exposed through the opening 201, and the entire surface of the partition wall 200 (step S103d).

Since this process is the same as the process of step S103a in the above-described first example, its description will be omitted.

Next, the lyophobic property vesting process is performed on the first partition wall 220 (step S103e).

Specifically, as shown in FIG. 15, a $CF_4$ plasma jet P4 is irradiated onto the first partition wall 220 by the spot type plasma irradiation unit 9 (see the long dashed double-short dashed line).

In FIG. 15, the plasma irradiation unit 9 is moved as indicated by an arrow 530 to irradiate the $CF_4$ plasma jet P4 onto the first partition wall 220. At this time, the plasma irradiation unit 9 has only to move in such a way as not to irradiate the top surface region of the substrate 100 exposed through the opening 201, but to irradiate the $CF_4$ plasma jet P4 onto the entire surface of the first partition wall 220. It is unnecessary to irradiate the $CF_4$ plasma jet P4 up to the ends of the first partition wall 220 in the lengthwise direction thereof.

The lyophilic property vesting process of the ends of the first partition wall 220 in the lengthwise direction thereof makes the lyophobic degree of the ends of the first partition wall 220 lower than the lyophobic degree of the center of the first partition wall 220. This can prevent or reduce the force-back of the ink more.

This $CF_4$ plasma process can permit fluoride to remain on the surface of the first partition wall 220 and make the surface thereof lyophobic. The process of making the lyophobic degree of the second partition wall 230 lower than the lyophobic degree of the center of the first partition wall 220 is carried out in this way.

In the above manner, it is possible to reduce the number of plasma processes as compared with the first example by making at least part of the first partition wall 220 (especially, portion including the center of the first partition wall 220 in the lengthwise direction (e.g., 90% or more)) lyophobic, but not the second partition wall 230.

If the lyophobic degree of the second partition wall 230 becomes lower than the lyophobic degree of the center of the first partition wall 220 in the lengthwise direction, step S103a or step S103d may be skipped in the first example and the second example. In this case, effects similar to those in the above-described examples may be obtained.

(4) Step S104

In step S104, the luminous layer 300 is formed.

Specifically, a first ink is applied inside the opening 201 (groove). Then, the solvent in the applied first ink is dried to form the luminous layer 300. When the light emitting device 1 has R (Red), G (Green) and B (Blue) pixels, application of the ink (especially, the ink that forms a center layer to be described later) is separated.

The first ink contains a known polymer luminous material capable of emitting light, e.g., a luminous material containing conjugated double bond polymer, such as polyparaphenylenevinyl or polyfluorene. The ink is a liquid which has this polymer luminous material dissolved or dispersed into a solvent. The solvent is, for example, a water solvent, or an organic solvent, such as tetralin, tetramethylenebenzen, mesitylene or xylene. The layer that is formed by using such a first ink performs light emission, and serves as the core layer in the luminous layer 300. Hereinafter, this layer will be called "center layer".

The method of applying the first ink is realized by nozzle printing of keeping ejection of the ink using an ejection nozzle, ink jet printing based on ink jetting, or the like. As described above, the first ink is applied in such a way as to cover the entire bottom surface of the groove (see the ink level 301 in FIG. 8). At this time, the second partition wall 230 is not made lyophobic (particularly, it is lyophilized), so that force-back of the ink can be prevented or reduced. It is therefore possible to eliminate or reduce a region uncovered with the luminous layer 300 at the bottom surface of the groove formed by the partition wall 200 and the substrate 100. In FIG. 5 and other diagrams, there is no region which is not covered with the luminous layer 300 at the bottom surface of the groove.

In addition, drying in the atmospheric environment, drying in the nitrogen atmosphere, drying in vacuum, or heating and drying in any one of the atmospheres can be adopted as the method of drying the solvent in the applied first ink.

The luminous layer 300 emits light with a voltage to be applied by the pixel electrodes 129 (anode angle) and the opposing electrode 400 (cathode electrode).

Although the luminous layer 300 is formed by the center layer in the above example, the luminous layer 300 may include a center layer 310, a hole injection layer 330, and an interlayer 350. The luminous layer 300 should have at least the center layer 310.

When the luminous layer 300 has the hole injection layer 330, before forming the center layer 310, a second ink is applied inside the opening 201 (groove), and a solvent in the applied second ink is dried to form the hole injection layer 330.

The hole injection layer 330 is formed between the pixel electrodes 129 and the center layer 310 (interlayer 350). The hole injection layer 330 has a function of supplying holes to the center layer 310. The hole injection layer 330 includes an organic polymer material capable of injecting and transporting holes, e.g., polyethylenedioxy thiophene (PEDOT) as conductive polymer, and poly(styrenesulfonate) (PSS) as dopant. That is, the second ink is a liquid which has the aforementioned organic polymer material dissolved or dispersed into a water solvent or an organic solvent, such as tetralin, tetramethylenebenzen, mesitylene or xylene. The method of applying the second ink is, for example, realized by nozzle printing of continuous ejection of the ink using an ejection nozzle, ink jet printing based on ink jetting, or the like. The second ink is applied in such a way as to cover the entire bottom surface of the groove (the same as indicated by the ink level 301 in FIG. 8). At this time, the second partition wall 230 is not made lyophobic (particularly, it is lyophilized), so that force-back of the ink can be prevented or reduced. It is therefore possible to eliminate or reduce a region uncovered with the luminous layer 300 (especially, hole injection layer 330) at the bottom surface of the groove formed by the partition wall 200 and the substrate 100.

A process similar to the step S103 may be executed after formation of the hole injection layer 330. This can prevent or reduce force-back of the first ink or the second ink more at the time of forming the center layer 310 or the interlayer 350 to be described later.

When the luminous layer 300 has the interlayer 350, before forming the center layer 310, a third ink is applied inside the opening 201 (groove), and a solvent in the applied third ink is dried to form the interlayer 350. The interlayer 350 is formed between the hole injection layer 330 and the center layer 310. The interlayer 350 has a function of blocking electrons from the luminous layer 300 to make recombination of electrons and holes in the luminous layer 300 easier and enhance the light emission efficiency of the luminous layer 300. The interlayer 350 is made of a proper organic polymer material which blocks the electrons from the luminous layer 300. That is, the third ink is a liquid which has the aforementioned organic polymer material dissolved or dispersed into a water solvent or an organic solvent, such as tetralin, tetramethylenebenzen, mesitylene or xylene.

The method of applying the third ink is, for example, realized by nozzle printing of continuous ejection of the ink using an ejection nozzle, ink jet printing based on ink jetting, or the like. The third ink is applied in such a way as to cover the entire bottom surface of the groove (the same as indicated by the ink level 301 in FIG. 8). A process similar to the step S103 may be executed after formation of the interlayer 350. This can prevent or reduce force-back of the first ink more at the time of forming the center layer 310.

(5) Step S105

In step S105, the opposing electrode 400 is formed.

The opposing electrode 400 is formed on the luminous layer 300. The opposing electrode 400 has a laminate structure having a lower layer for electron injection, which is made of a conductive material or a material having a low work function, such as Li, Mg, Ca or Ba, and an upper layer made of a light reflection conductive metal, such as Al. The opposing electrode 400 comprises a single electrode laminate which is formed on substantially the entire surface of the substrate which has the luminous layer 300 formed thereon (see FIG. 6).

The opposing electrode 400 is applied with a common voltage Vss which is the ground potential, for example.

The opposing electrode 400 is formed by vacuum deposition or sputtering.

Each light emitting element includes an individual pixel electrode 129, an individual region for the luminous layer 300 which is positioned to overly the respective pixel electrode 129, and an individual region for the opposing electrode 400 which is positioned to overlie the respective pixel electrode 129 via the luminous layer 300.

(6) Step S106

In step S106, sealing is carried out.

A sealing resin comprising an ultraviolet curing resin or heat curing resin is applied onto the substrate 100 which has the opposing electrode 400 formed thereon, outside the display region 150 where a plurality of pixels PIX each having a light emitting element are formed, and an sealing substrate and the substrate 100 are adhered together.

Next, the sealing resin is cured by ultraviolet rays or heat. As a result, the substrate 100 and the sealing substrate are adhered together.

The light emitting device 1 is manufactured through the foregoing processes.

In the light emitting device 1 according to the embodiment, the lyophobic degree of the second partition wall 230 on the substrate 100 is set lower than the lyophobic degree of the center of the first partition wall 220 in the lengthwise direction.

As mentioned above, the light emitting device 1 according to the embodiment is configured in such a way that the center surface of the first partition wall 220 contains a larger amount of the lyophobic material than the surface of the second partition wall 230.

Accordingly, as described above, the light emitting device 1 can be configured to have no region uncovered with the luminous layer 300 at the bottom surface of the groove formed by the partition wall 200 (a pair of first partition walls (A, B, C, . . . ) and at least one second partition wall 230) and the substrate 100, or reduce such a region as compared with the related art.

An electronic device which uses the light emitting device 1 according to the embodiment will be described next.

The light emitting device 1 which takes the foregoing configuration is used in the display unit (display) of an electronic device, such as a digital camera, a personal computer or a cellular phone.

Figure 17:
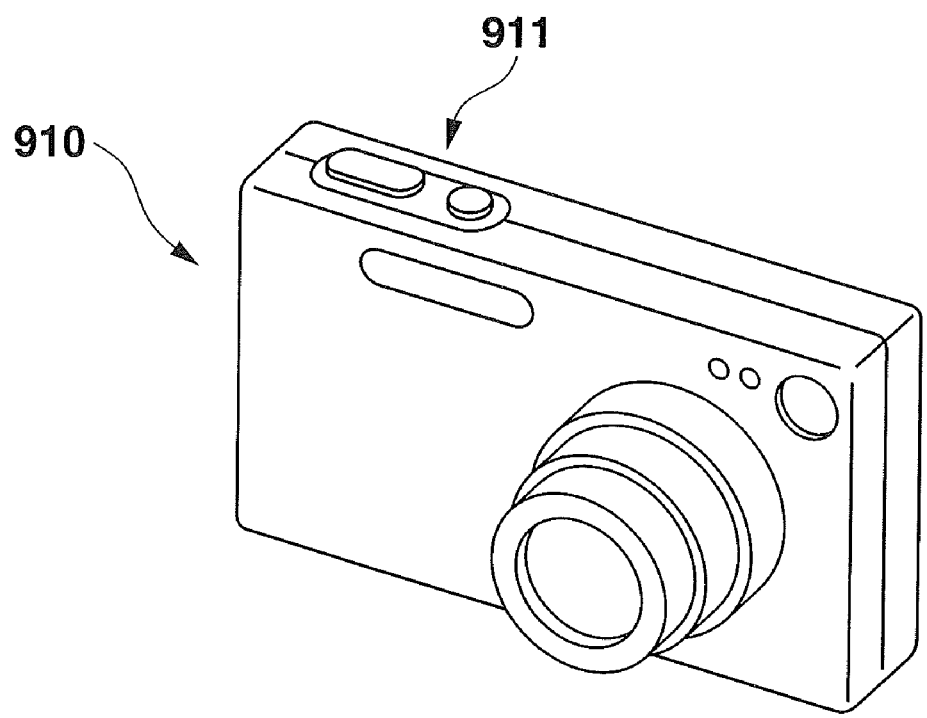
FIG. 17 is a diagram of a digital camera which uses the light emitting device according to the embodiment of the invention in its display unit.
Figure 18:
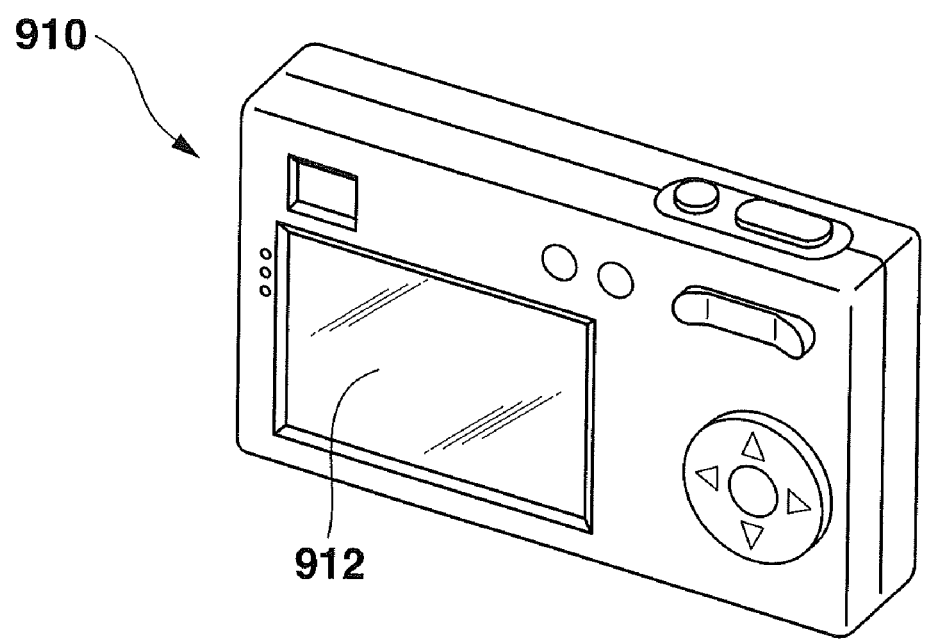
FIG. 18 is a diagram of the digital camera which uses the light emitting device according to the embodiment of the invention in its display unit.

Specifically, a digital camera 910 has an operation unit 911 and a display unit 912 as shown in FIGS. 17 and 18, for example. The light emitting device 1 is used in the display unit 912.

Figure 19:
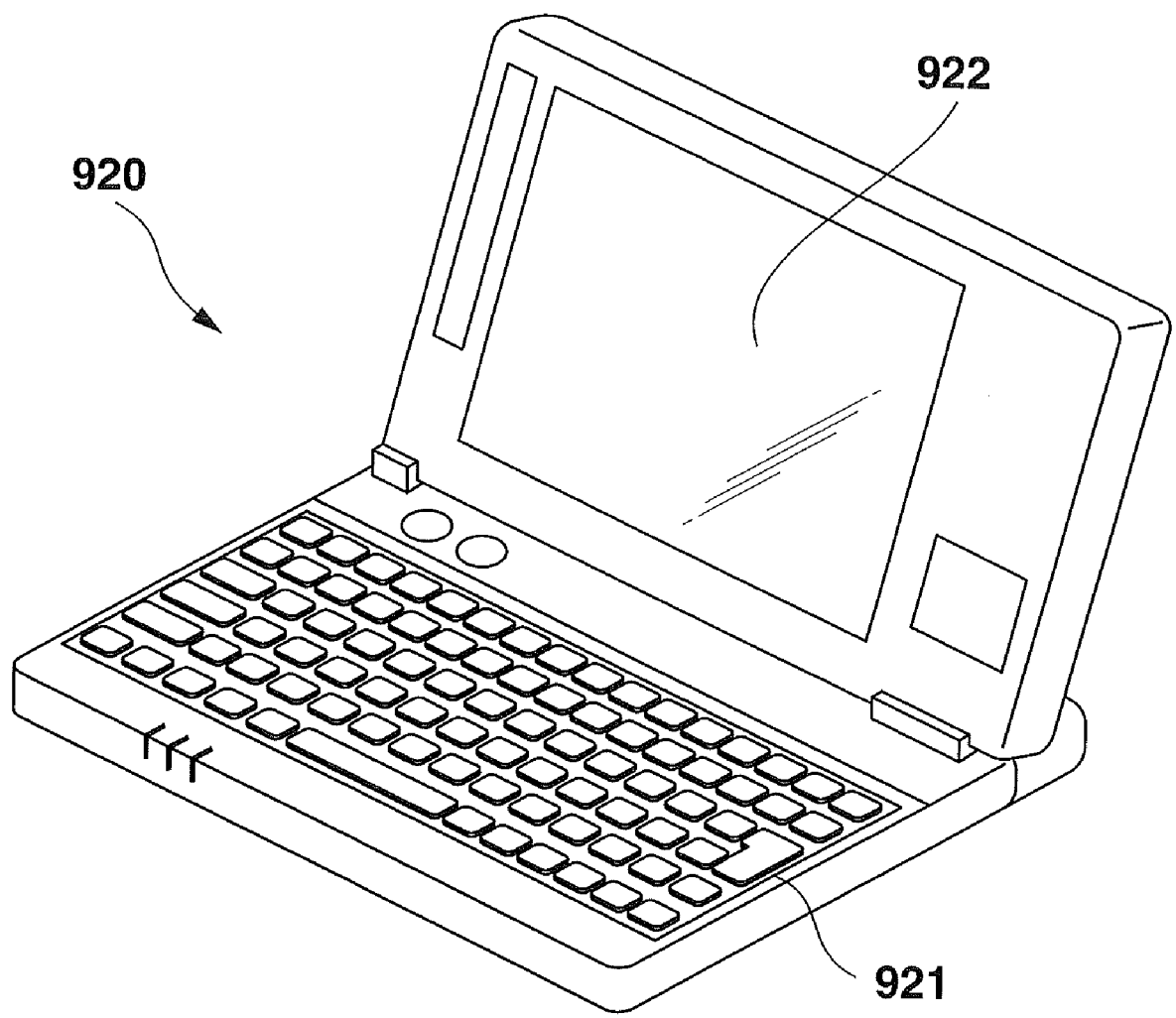
FIG. 19 is a diagram of a notebook personal computer which uses the light emitting device according to the embodiment of the invention in its display unit.

Likewise, as shown in FIG. 19, a personal computer 920 has an operation unit 921 and a display unit 922, and the light emitting device 1 is used in the display unit 922.

Figure 20:
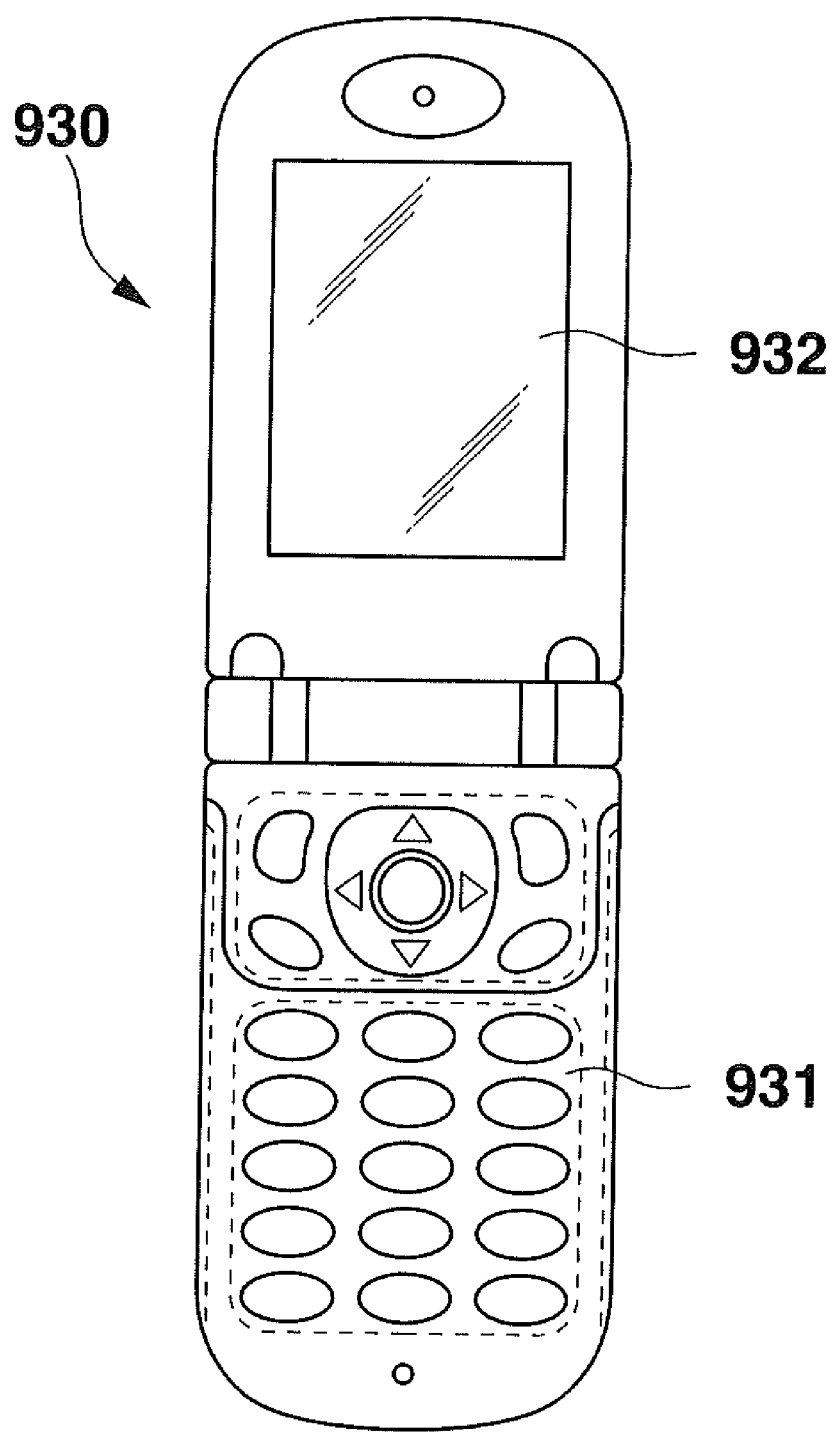
FIG. 20 is a diagram of a cellular phone which uses the light emitting device according to the embodiment of the invention in its display unit.

Further, as shown in FIG. 20, a cellular phone 930 has an operation unit 931 and a display unit 932, and the light emitting device 1 is used in the display unit 932.

The foregoing description of the embodiment has been given of the case where the light emitting device 1 is a so-called bottom-emission type light emitting device which emits light, emitted from the luminous layer 300, outside from the base 110. However, the light emitting device 1 may be a top-emission type light emitting device which emits light, emitted from the luminous layer 300, outside from opposite side of the base 110.

In addition, the ink applying methods (printing methods) in the embodiment are not limited to the nozzle printing and ink jet printing, and may be typographic printing, relief printing such as flexible printing, lithographic printing such as offset printing, intaglio printing such as gravure printing, stencil printing such as screen printing, or the like.

While the light emitting device 1 according to the embodiment can be used in a display device as apparent from the above, the light emitting device 1 may be used in an exposure device, such as a printer head, which irradiates light on the photosensitive drum of a printer.

What is claimed is:

1. A method of manufacturing a light emitting device having at least one pixel having a light emitting element, the method comprising:
   a partition-wall forming step of forming a plurality of first partition walls in such a way as to extend in a first direction over a substrate and partition a luminous-layer forming region where a luminous layer of the light emitting element is to be formed, and at least one second partition wall in such a way as to extend in a second direction orthogonal to the first direction and connect end portions of the plurality of first partition walls;
   a lyophobic-degree adjusting step of adjusting lyophobic degrees of the first partition walls and the second partition wall such that the lyophobic degree of the second partition wall becomes lower than that of a center region between both ends of each of the first partition walls in the first direction;
   wherein the lyophobic-degree adjusting step includes a first plasma irradiation step and a second plasma irradiation step;
   wherein the first plasma irradiation step includes a step of moving a spot type plasma irradiation unit, which locally discharges a plasma jet, along the first and second partition walls while discharging the plasma jet containing $CF_4$ plasma from the spot type plasma irradiation unit, thereby irradiating the $CF_4$ plasma onto each of the first and second partition walls selectively to vest each of the first partition walls and the second partition wall with a lyophobic property; and
   wherein the second plasma irradiation step includes a step of moving the spot type plasma irradiation unit along the second partition wall while discharging the plasma jet containing oxygen plasma from the plasma irradiation unit, thereby irradiating the oxygen plasma onto the second partition wall selectively to lyophilize the second partition wall.

2. The method according to claim 1, further comprising a third plasma irradiation step of irradiating oxygen plasma onto a surface of the luminous-layer forming region, each of the first partition walls, and the second partition wall to lyophilize the surface of the luminous-layer forming region, each of the first partition walls, and the second partition wall;
   wherein the third plasma irradiation step is executed prior to the first plasma irradiation step.

3. A method of manufacturing a light emitting device having at least one pixel having a light emitting element, the method comprising:
   a partition-wall forming step of forming a plurality of first partition walls in such a way as to extend in a first direction over a substrate and partition a luminous-layer forming region where a luminous layer of the light emitting element is to be formed, and at least one second partition wall in such a way as to extend in a second direction orthogonal to the first direction and connect end portions of the plurality of first partition walls; and
   a lyophobic-degree adjusting step of adjusting lyophobic degrees of the first partition walls and the second partition wall such that the lyophobic degree of the second partition wall becomes lower than that of a center region between both ends of each of the first partition walls in the first direction;
   wherein the lyophobic-degree adjusting step includes a first plasma irradiation step and a second plasma irradiation step;
   wherein the first plasma irradiation step includes a step of irradiating oxygen plasma onto a surface of the substrate, each of the first partition walls, and the second partition wall to lyophilize the surface of the substrate, each of the first partition walls, and the second partition wall; and
   wherein the second plasma irradiation step includes a step of moving a spot type plasma irradiation unit, which locally discharges a plasma jet, along a region including at least the center region of each of the first partition walls while discharging the plasma jet containing $CF_4$ plasma from the spot type plasma irradiation unit, thereby irradiating the $CF_4$ plasma selectively onto the region including at least the center region of each of the first partition walls to vest the region including at least the center region of each of the first partition walls with a lyophobic property.

* * * * *